United States Patent
Sasaki

(10) Patent No.: US 9,640,530 B2
(45) Date of Patent: May 2, 2017

(54) SEMICONDUCTOR DEVICE

(71) Applicant: Mitsubishi Electric Corporation, Tokyo (JP)

(72) Inventor: Yoshinobu Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/931,416

(22) Filed: Nov. 3, 2015

(65) Prior Publication Data

US 2016/0247798 A1  Aug. 25, 2016

(30) Foreign Application Priority Data

Feb. 25, 2015  (JP) .................. 2015-035644

(51) Int. Cl.
*H01L 27/06* (2006.01)
*H01L 23/66* (2006.01)
(Continued)

(52) U.S. Cl.
CPC .......... *H01L 27/0682* (2013.01); *H01L 23/66* (2013.01); *H01L 24/49* (2013.01); *H01L 24/48* (2013.01); *H01L 25/16* (2013.01); *H01L 2223/6611* (2013.01); *H01L 2223/6655* (2013.01); *H01L 2224/04042* (2013.01); *H01L 2224/48091* (2013.01); *H01L 2224/48195* (2013.01); *H01L 2224/48247* (2013.01); *H01L 2224/49112* (2013.01);
(Continued)

(58) Field of Classification Search
CPC ..... H01L 27/0682; H01L 28/10; H01L 28/20; H01L 28/40; H01L 23/66; H01L 24/49; H01L 24/48; H01L 2223/6611; H01L 2223/6655; H01L 2224/04042; H01L 2224/48091; H01L 2224/48195; H01L 2224/48247

See application file for complete search history.

(56) References Cited

U.S. PATENT DOCUMENTS

| 2003/0084408 A1 | 5/2003 | Sasaki |
| 2013/0106519 A1 | 5/2013 | Kamiyama et al. |
| 2013/0120069 A1* | 5/2013 | Takagi .................. H03F 3/195 330/295 |

FOREIGN PATENT DOCUMENTS

| JP | H07-074557 A | 3/1995 |
| JP | H10-083998 A | 3/1998 |

(Continued)

*Primary Examiner* — Moazzam Hossain
*Assistant Examiner* — Farun Lu
(74) *Attorney, Agent, or Firm* — Studebaker & Brackett PC

(57) ABSTRACT

A semiconductor device includes a package, an input terminal fixed to the package, an input pre-matched substrate provided in the package, a semiconductor element provided in the package and formed on a substrate different from the input pre-matched substrate, a matching circuit including a circuit element formed on the input pre-matched substrate, a first wire for connecting the input terminal and the circuit element, and a second wire for connecting the circuit element and the semiconductor element, a first MIM capacitor formed as part of the circuit element, and a first stabilization circuit formed as part of the circuit element to reduce oscillation, wherein a lower electrode of the first MIM capacitor is connected to the package through a via provided in the input pre-matched substrate.

12 Claims, 13 Drawing Sheets

(51) Int. Cl.
*H01L 23/00* (2006.01)
*H01L 25/16* (2006.01)

(52) U.S. Cl.
CPC .............. *H01L 2224/49113* (2013.01); *H01L 2224/49175* (2013.01); *H01L 2924/00014* (2013.01); *H01L 2924/1033* (2013.01); *H01L 2924/1306* (2013.01); *H01L 2924/19041* (2013.01); *H01L 2924/19042* (2013.01); *H01L 2924/19105* (2013.01); *H01L 2924/19107* (2013.01)

(56) References Cited

FOREIGN PATENT DOCUMENTS

| | | |
|---|---|---|
| JP | H11-103205 A | 4/1999 |
| JP | 2001-148616 A | 5/2001 |
| JP | 2003-142952 A | 5/2003 |
| JP | 2005-051062 A | 2/2005 |
| JP | 2007-027317 A | 2/2007 |
| JP | 2007-295367 A | 11/2007 |
| WO | 2012/106519 A1 | 11/2012 |

\* cited by examiner

SEMICONDUCTOR DEVICE

BACKGROUND OF THE INVENTION

Field of the Invention

The present invention relates to a semiconductor device for use in high-frequency amplification or the like.

Background Art

Japanese Patent Laid-Open No. H11-103205 discloses an input matching circuit connected to an FET (field-effect transistor). This input matching circuit is provided with a parallel resistor constituting a stabilization circuit.

To reduce unstable operation such as an oscillation, it is preferable to provide a stabilization circuit in a pre-matched circuit. It is preferable to provide a semiconductor device in which unstable operation can be reduced and which is suitable for miniaturization.

SUMMARY OF THE INVENTION

The present invention has been made to solve the above-described problem, and an object of the present invention is to provide a semiconductor device in which unstable operation can be reduced and which is suitable for miniaturization.

The features and advantages of the present invention may be summarized as follows.

According to one aspect of the present invention, a semiconductor device includes a package, an input terminal fixed to the package, an input pre-matched substrate provided in the package, a semiconductor element provided in the package and formed on a substrate different from the input pre-matched substrate, a matching circuit including a circuit element formed on the input pre-matched substrate, a first wire for connecting the input terminal and the circuit element, and a second wire for connecting the circuit element and the semiconductor element, a first MIM capacitor formed as part of the circuit element, and a first stabilization circuit formed as part of the circuit element to reduce oscillation. A lower electrode of the first MIM capacitor is connected to the package through a via provided in the input pre-matched substrate.

Other and further objects, features and advantages of the invention will appear more fully from the following description.

DETAILED DESCRIPTION OF THE PREFERRED EMBODIMENTS

Semiconductor devices according to embodiments of the present invention will be described with reference to the drawings. The same or corresponding components will be denoted by the same reference signs, and the repetition of explanation thereof may be omitted.

First Embodiment

Figure 1:
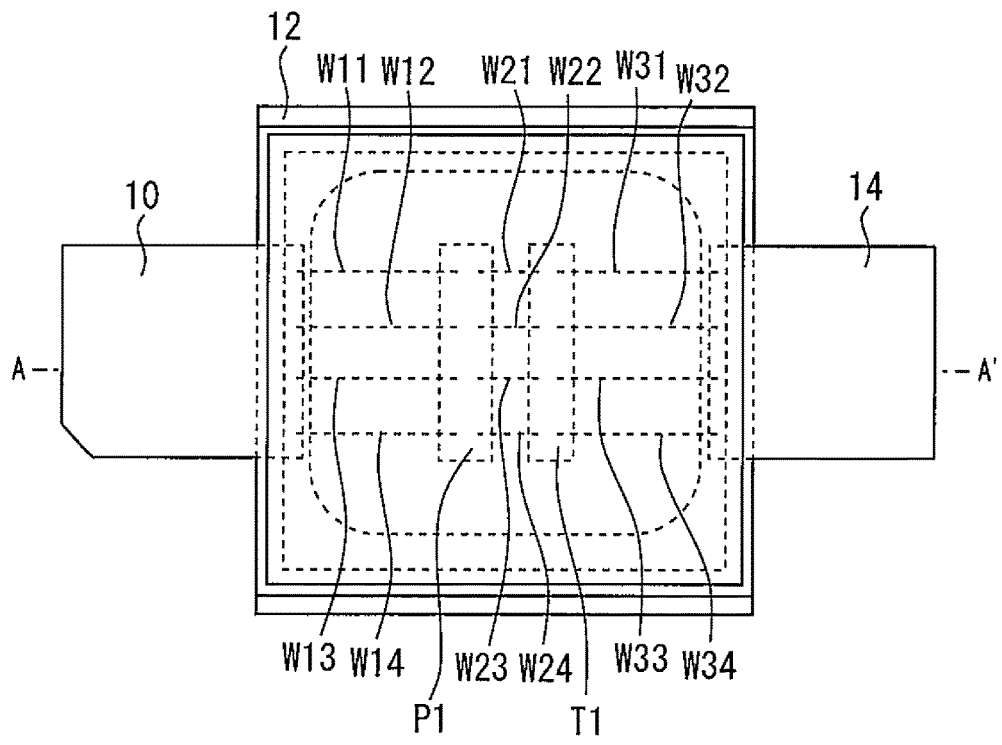
FIG. 1 is a general view of a semiconductor device according to first embodiment.

FIG. 1 is a general view of a semiconductor device according to first embodiment of the present invention. This semiconductor device includes an input terminal 10, a package 12, and an output terminal 14. The input terminal 10 and the output terminal 14 are fixed to the package 12. The internal configuration of the package 12 cannot be seen from the outside, but is represented by broken lines for convenience of explanation. An input pre-matched substrate P1 is provided in the package 12. Moreover, a semiconductor element T1 formed on a substrate different from the input pre-matched substrate P1 is provided in the package 12. The semiconductor element T1 is a field-effect transistor formed of, for example, GaN or the like.

The input terminal 10 and the input pre-matched substrate P1 are connected to each other with first wires W11, W12, W13, and W14. The input pre-matched substrate P1 and the semiconductor element T1 are connected to each other with second wires W21, W22, W23, and W24. The semiconductor element T1 and the output terminal 14 are connected to each other with output wires W31, W32, W33, and W34.

Figure 2:
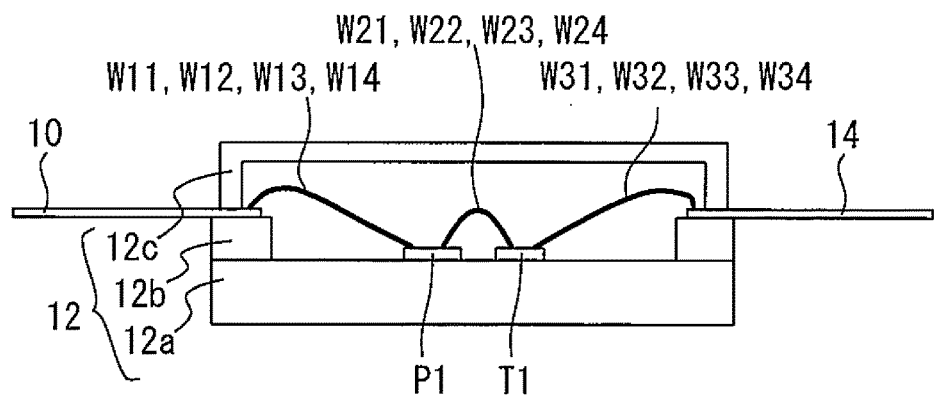
FIG. 2 is a cross-sectional view taken along line A-A' of FIG. 1.

FIG. 2 is a cross-sectional view taken along line A-A' of FIG. 1. The package 12 includes a metal base portion 12a, a side wall portion 12b, and a lid portion 12c.

Figure 3:
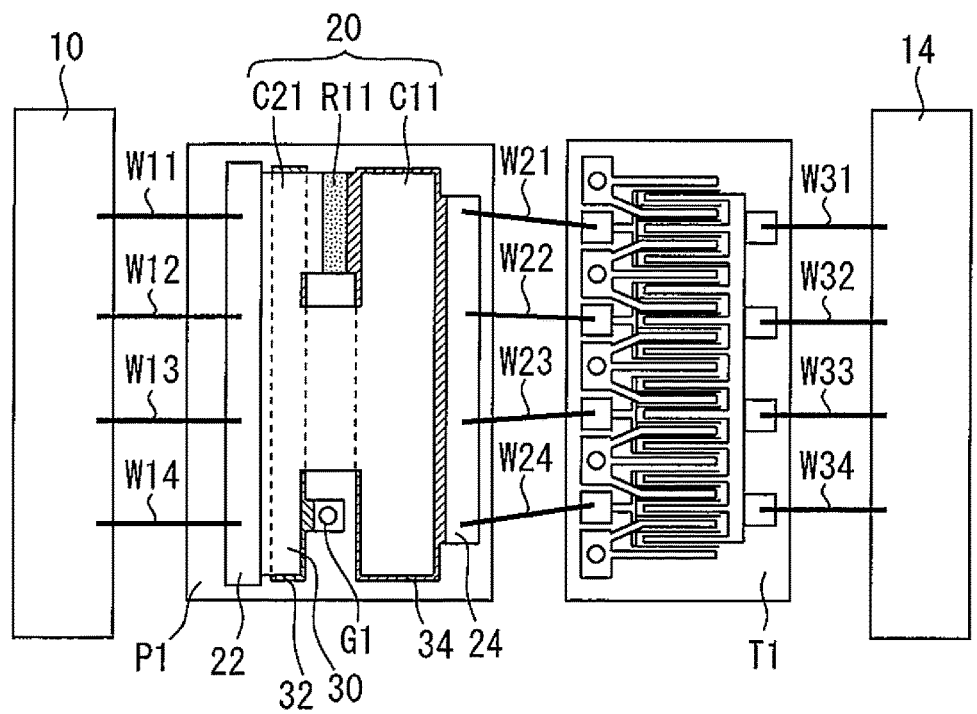
FIG. 3 is a diagram showing the inside of the package.

FIG. 3 is a diagram showing the inside of the package 12. A circuit element 20 is formed on the input pre-matched substrate P1. The circuit element 20, the first wires W11, W12, W13, and W14 for connecting the input terminal 10 and the circuit element 20 (input pre-matched substrate P1), and the second wires W21, W22, W23, and W24 for connecting the circuit element 20 and the semiconductor element T1 constitute a matching circuit.

The circuit element 20 includes a first MIM (Metal Insulator Metal) capacitor C21. The first MIM capacitor C21 includes an upper electrode 30, a lower electrode 32, and a dielectric provided therebetween. The upper electrode 30 is connected to a first pad 22. Portions of the lower electrode 32 which overlap the upper electrode 30 are represented by broken lines. The lower electrode 32 is connected to the package 12 through a via G1 provided in the input pre-matched substrate P1. The via G1 is formed by, for example, forming a through hole in the input pre-matched substrate P1 and filling the through hole with a metallic material. Such a via may also be referred to as a via hole. The via G1 may also be formed by plating. The first MIM capacitor C21 serves as a shunt capacitor constituting a pre-matched circuit by being connected to the via G1.

A second MIM capacitor C11 is formed on the input pre-matched substrate P1. The second MIM capacitor C11 includes an upper electrode 30, a lower electrode 34, and a dielectric provided therebetween. The first MIM capacitor C21 and the second MIM capacitor C11 share the common upper electrode 30. A first resistor R11 contacts the upper electrode 30 on a left side thereof and contacts the lower electrode 34 on a right side thereof to be connected in parallel to the second MIM capacitor C11. The second MIM capacitor C11 and the first resistor R11 are collectively referred to as a first stabilization circuit.

The lower electrode 34 is connected to a pad 24. The second wires W21, W22, W23, and W24 connect the pad 24 and a gate of the semiconductor element T1. The output wires W31, W32, W33, and W34 connect a drain of the semiconductor element T1 and the output terminal 14.

Figure 4:
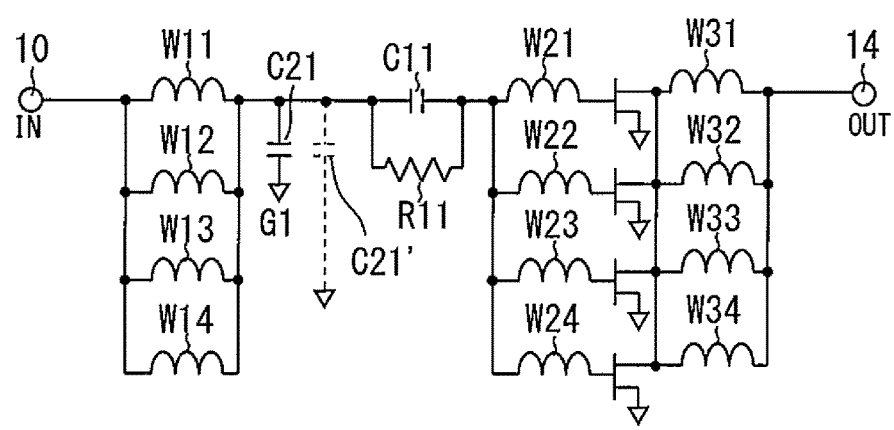
FIG. 4 is an equivalent circuit diagram of the semiconductor device according to first embodiment.

FIG. 4 is an equivalent circuit diagram of the semiconductor device according to first embodiment of the present invention. A capacitance C21' is a parasitic capacitance between the circuit element 20 and the package 12.

The first MIM capacitor C21 according to first embodiment of the present invention is connected to the package 12 (grounded) through the via G1. Accordingly, a shunt capacitor (first MIM capacitor C21) can be easily formed on the input pre-matched substrate P1.

The second MIM capacitor C11 and the first resistor R11 constitute a first stabilization circuit. As the frequency of a signal propagating in the semiconductor device decreases, a signal passing through the second MIM capacitor C11 decreases, and a signal passing through the first resistor R11 increases. Accordingly, loss increases. Thus, the entire circuit becomes less likely to oscillate and becomes stable.

Since the first MIM capacitor C21 and the first stabilization circuit are formed on the same substrate, the size of the semiconductor device can be made smaller than in the case where these are respectively formed on separate substrates. Moreover, forming the first MIM capacitor C21 and the first stabilization circuit on the same substrate enables the parasitic capacitance C21' formed by the first MIM capacitor C21 and the first stabilization circuit to be used as part of the matching circuit. Accordingly, the matching circuit can cover a wider bandwidth and can be made smaller.

Constants of the first stabilization circuit need to be optimized in accordance with a frequency band to be used. In first embodiment of the present invention, the first stabilization circuit is formed on the input pre-matched substrate P1, which is separate from the semiconductor element T1. Accordingly, a first stabilization circuit suitable for the frequency to be used can be provided without replacing the semiconductor element T1 every time the frequency to be used is changed. In other words, the same semiconductor element T1 can be used for semiconductor devices (amplifiers) of different frequency bands.

Since the first MIM capacitor C21 and the second MIM capacitor C11 have MIM structures, a desired capacitance value can be easily obtained without changing the structure, e.g., changing the substrate thickness.

The semiconductor device according to first embodiment of the present invention can be variously modified within a range in which features thereof are not lost. The same is true in embodiments below. It should be noted that for semiconductor devices according to the embodiments below, differences from first embodiment will be mainly described.

Second Embodiment

Figure 5:
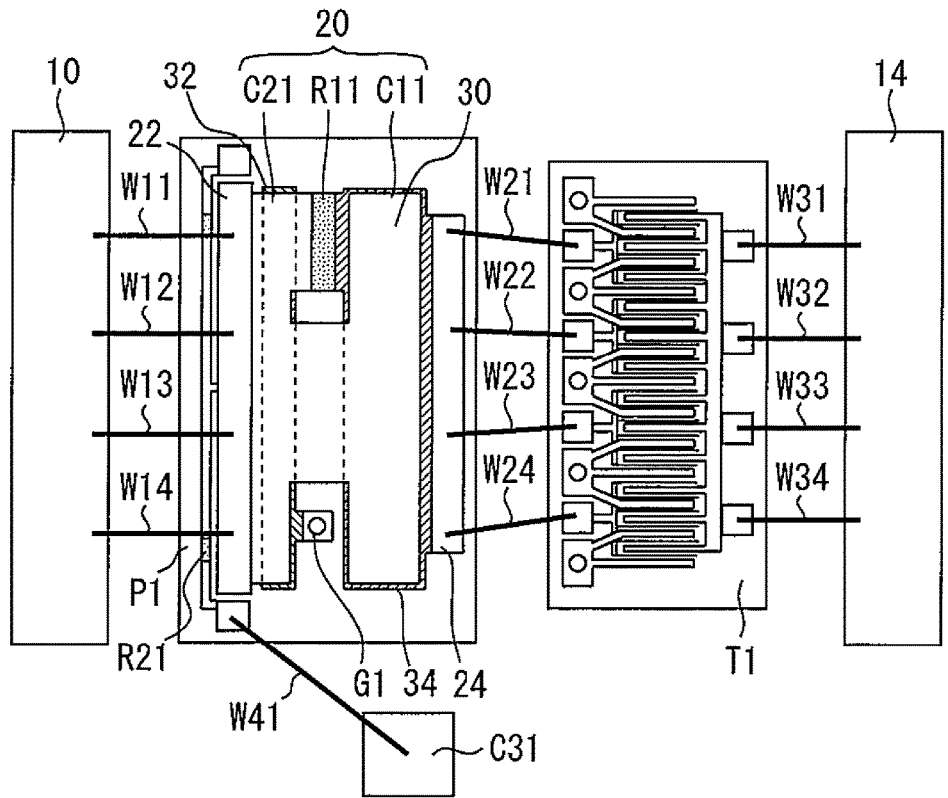
FIG. 5 is a plan view of a semiconductor device according to second embodiment.

FIG. 5 is a plan view of a semiconductor device according to second embodiment. The first pad 22 is a pad for connecting the first wires W11, W12, W13, and W14 which is formed on the input pre-matched substrate P1. A second resistor R21 formed on the input pre-matched substrate P1 is connected to the first pad 22. An external capacitor C31 is connected to the second resistor R21 through a connecting inductor (wire) W41.

The external capacitor C31 is provided in the package 12. An upper electrode of the external capacitor C31 is connected to the connecting inductor W41, and a lower electrode thereof is connected to the package 12. The second resistor R21, the connecting inductor W41, and the external capacitor C31 constitute a second stabilization circuit. The second stabilization circuit connects the first pad 22 and the package 12.

Figure 6:
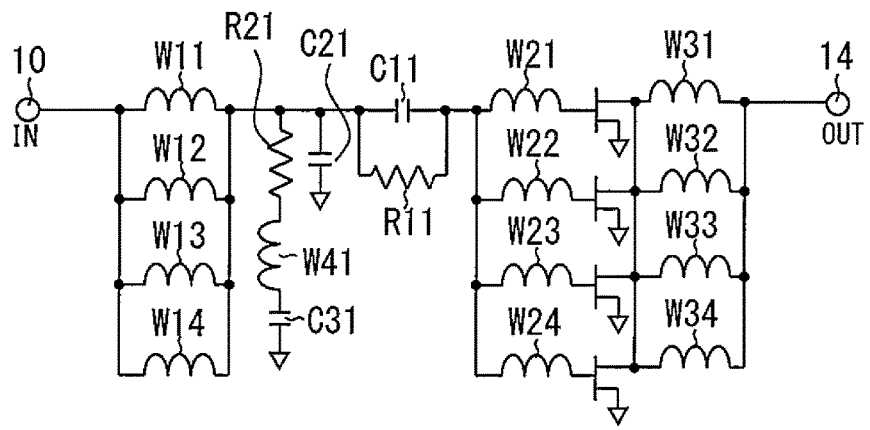
FIG. 6 is an equivalent circuit diagram of the semiconductor device of FIG. 5.

FIG. 6 is an equivalent circuit diagram of the semiconductor device of FIG. 5. In addition to the first stabilization circuit including the second MIM capacitor C11 and the first resistor R11, the second stabilization circuit including the second resistor R21, the connecting inductor W41, and the external capacitor C31 is provided.

The semiconductor device according to second embodiment of the present invention includes the first stabilization circuit (C11 and R11) and the second stabilization circuit (R21, W41, and C31). Accordingly, a semiconductor device which is stable over a wide bandwidth can be obtained by configuring the semiconductor device such that effective frequencies of the first stabilization circuit and those of the second stabilization circuit are different from each other.

For example, in the circuit formed by the connecting inductor W41 and the external capacitor C31, circuit constants are set so that resonance occurs at a low frequency. Near the frequency of resonance, impedances produced by the external capacitor C31 and the connecting inductor W41 are small, and only the second resistor R21 is effective. Accordingly, the circuit can be stabilized in a low-frequency band.

To make the semiconductor device smaller than in the case of the configuration of FIG. 5, the external capacitor C31 can be formed on the input pre-matched substrate P1.

Third Embodiment

Figure 7:
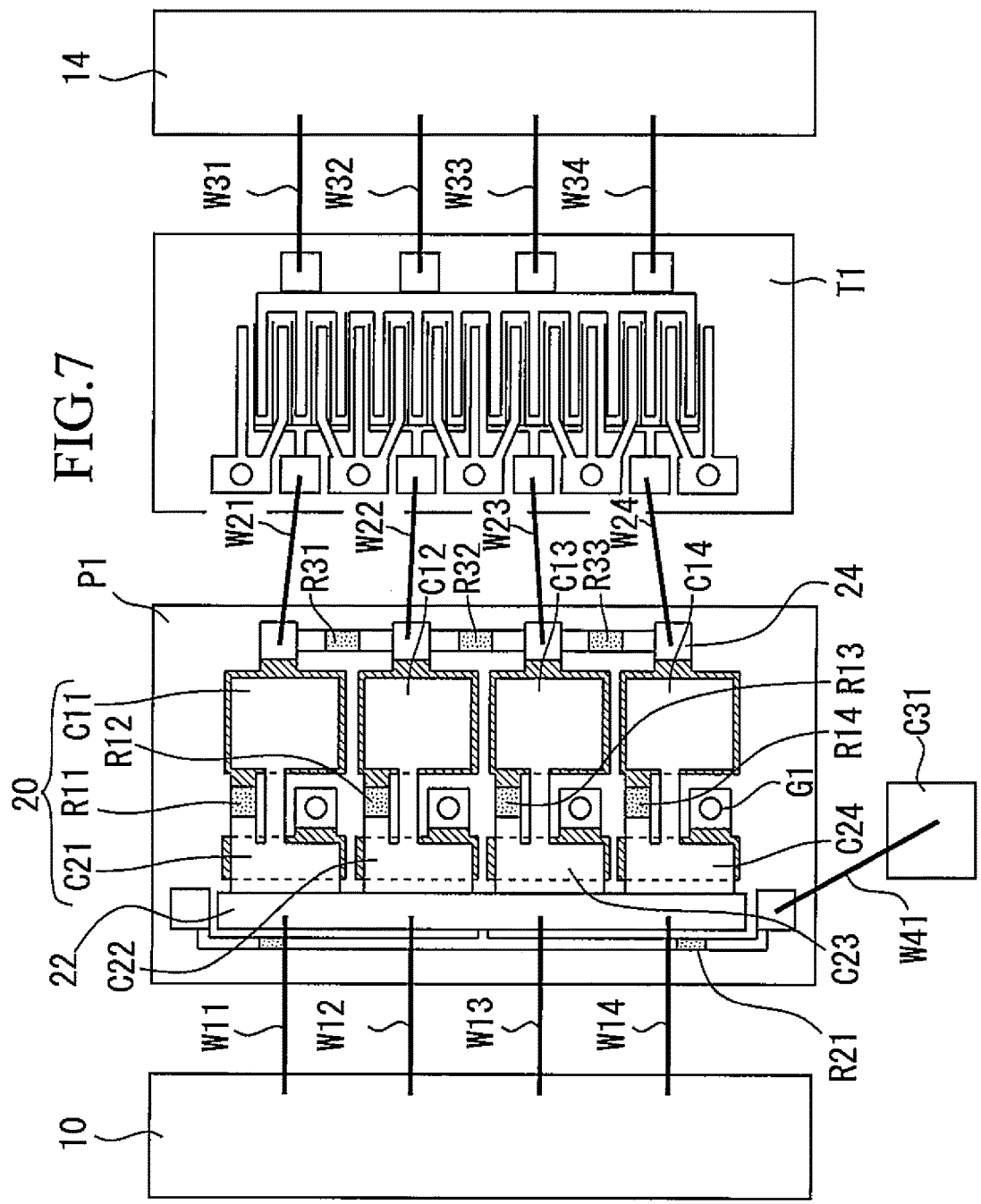
FIG. 7 is a plan view of a semiconductor device according to third embodiment.

FIG. 7 is a plan view of a semiconductor device according to third embodiment. This semiconductor device is provided with four first MIM capacitors C21, C22, C23, and C24. Each of the first MIM capacitors C21, C22, C23, and C24 individually has an upper electrode, a dielectric, and a lower electrode.

Each of the four first MIM capacitors C21, C22, C23, and C24 individually has a first stabilization circuit connected thereto. In other words, there are four first stabilization circuits. Specifically, there are provided a first stabilization circuit including the first resistor R11 and the second MIM capacitor C11, a first stabilization circuit including the first resistor R12 and the second MIM capacitor C12, a first stabilization circuit including the first resistor R13 and the second MIM capacitor C13, and a first stabilization circuit including the first resistor R14 and the second MIM capacitor C14.

Thus, the semiconductor device according to third embodiment is equivalent to a semiconductor device obtained by dividing each of the first MIM capacitor and the first stabilization circuit of second embodiment into four parts. Further, the four first stabilization circuits are connected to each other with third resistors R31, R32, and R33. Specifically, a lower electrode of the second MIM capacitor C11 and a lower electrode of the second MIM capacitor C12 are connected to each other with the third resistor R31. Further, a lower electrode of the second MIM capacitor C12 and a lower electrode of the second MIM capacitor C13 are connected to each other with the third resistor R32. Moreover, a lower electrode of the second MIM capacitor C13 and a lower electrode of the second MIM capacitor C14 are connected to each other with the third resistor R33.

Figure 8:
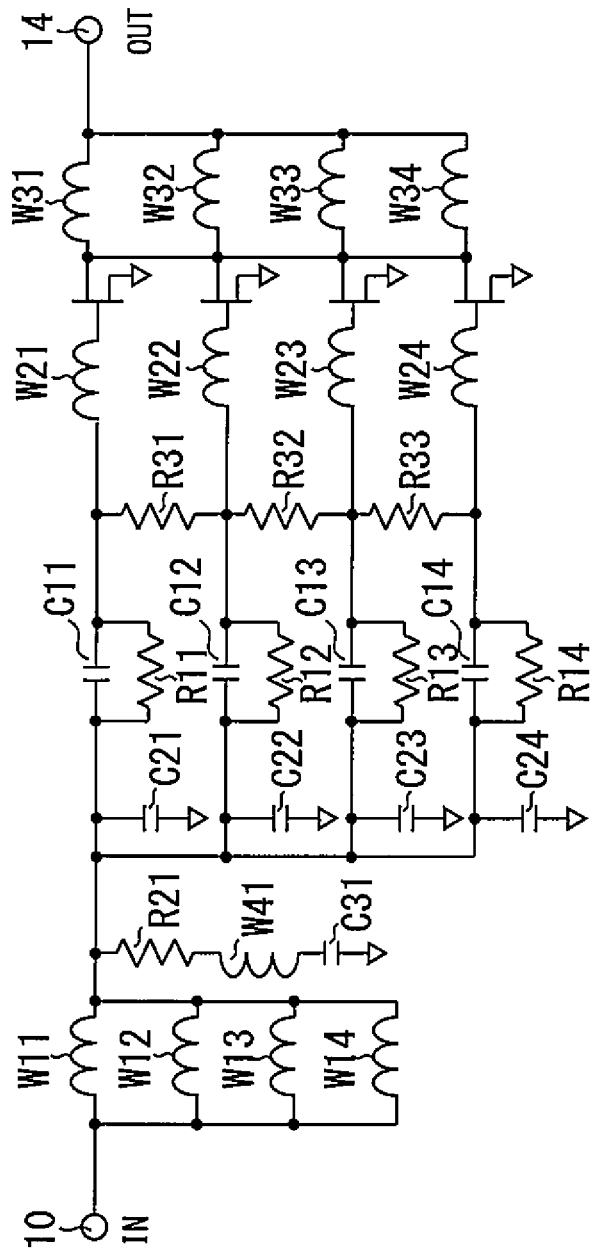
FIG. 8 is an equivalent circuit diagram of a semiconductor device of FIG. 7.

FIG. 8 is an equivalent circuit diagram of a semiconductor device of FIG. 7. As can be seen in FIGS. 7 and 8, one first MIM capacitor and one first stabilization circuit are assigned to one cell of the semiconductor element T1.

In the semiconductor device according to third embodiment of the present invention, a signal is transmitted through a plurality of first MIM capacitors and a plurality of first stabilization circuits, and the signal is evenly distributed to each cell in the semiconductor element T1. Accordingly, the semiconductor element T1 can evenly operate. Further, since the third resistors R31, R32, and R33 are provided between the pre-matched circuits, instability caused by imbalances between the cells can be reduced.

The number of first MIM capacitors may be any number greater than one, and is not limited to four. The number of first stabilization circuits may also be any number greater than one, and is not limited to four. The third resistors R31, R32, and R33 may be omitted.

Fourth Embodiment

Figure 9:
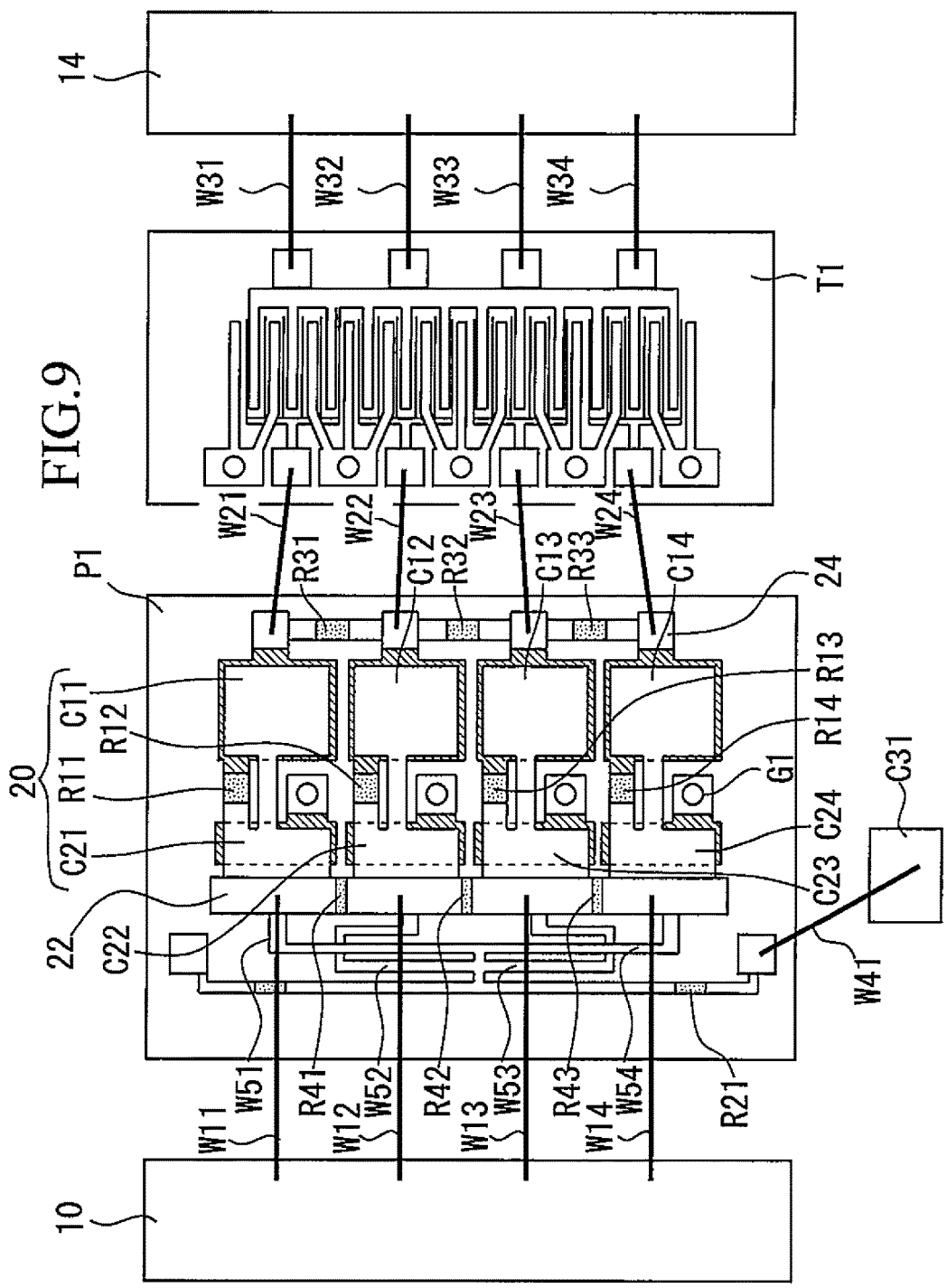
FIG. 9 is a plan view of a semiconductor device according to fourth embodiment.

FIG. 9 is a plan view of a semiconductor device according to fourth embodiment. This semiconductor device have many things in common with the semiconductor device of third embodiment shown in FIG. 7, and therefore differences from the semiconductor device of third embodiment will be mainly described.

Four first pads 22 are provided. The four first pads 22 are connected to each other with fourth resistors R41, R42, and R43. The four first pads 22 are connected to respective upper electrodes of the four first MIM capacitors C21, C22, C23, and C24.

A plurality of first patterns W51, W52, W53, and W54 are formed on the input pre-matched substrate P1. The plurality of first patterns W51, W52, W53, and W54 connect the first pads 22 and the second resistor R21. The lengths of the plurality of first patterns W51, W52, W53, and W54 are equal. Moreover, the first patterns W51, W52, W53, and W54 are joined together at one position on the input pre-matched substrate P1.

Figure 10:
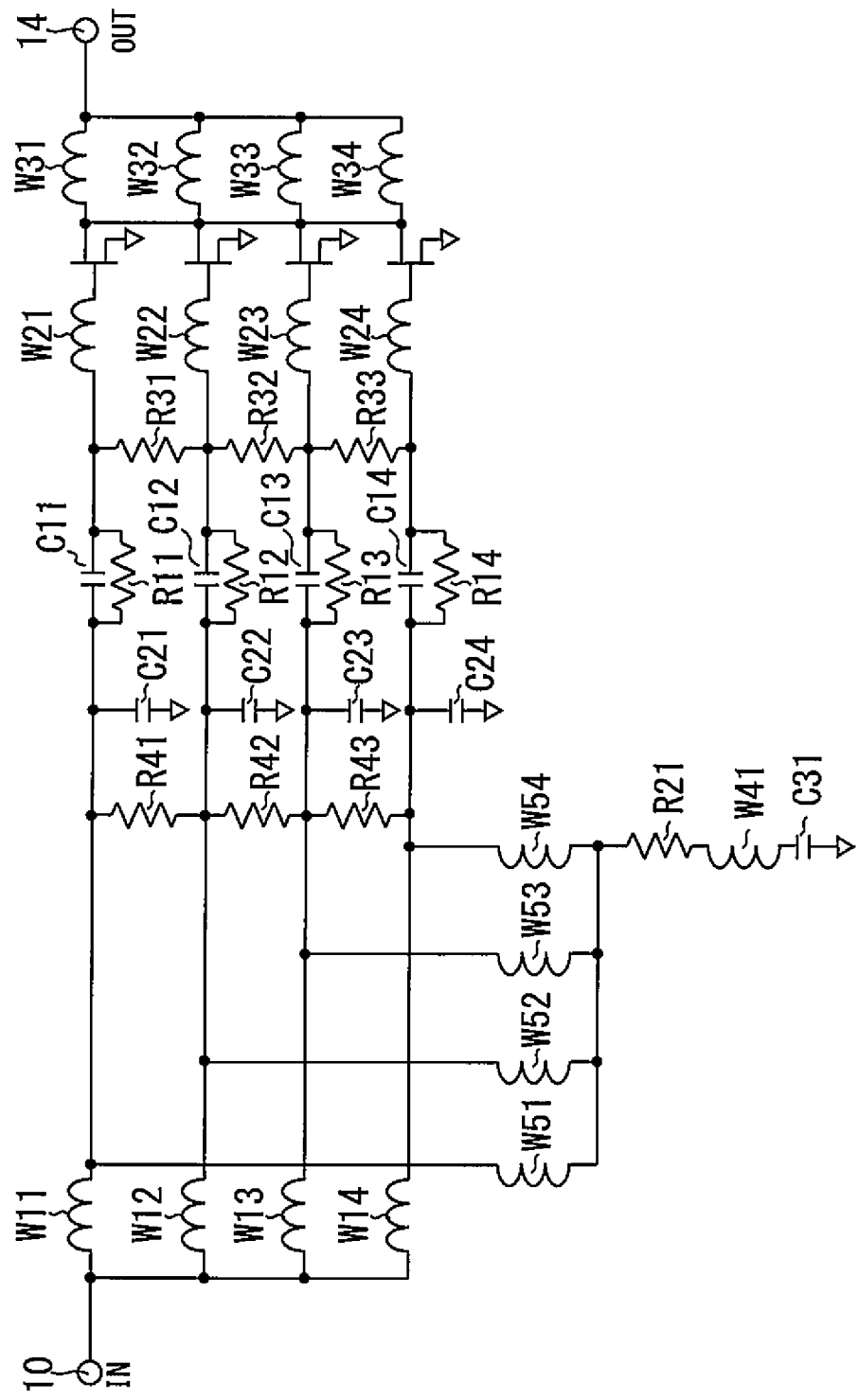
FIG. 10 is an equivalent circuit diagram of the semiconductor device of FIG. 9.

FIG. 10 is an equivalent circuit diagram of the semiconductor device of FIG. 9. The second stabilization circuit includes the first patterns W51, W52, W53, and W54, the second resistor R21, the connecting inductor W41, and the external capacitor C31.

Since the electrical lengths of the first patterns W51, W52, W53, and W54 are made equal, the impedances looking into the second stabilization circuit from the four pre-matched circuits (first MIM capacitors) are equal. Accordingly, the semiconductor device can be evenly operated. Moreover, since the first patterns W51, W52, W53, and W54 are joined together on the input pre-matched substrate P1, the influence of assembly variation can be made small. Specifically, the length of the connecting inductor W41 varies in accordance with the assembly variation of the input pre-matched substrate P1 and the external capacitor C31, but such fluctuation does not occur in the first patterns W51, W52, W53, and W54.

The wire length of the connecting inductor W41 can be made short by increasing the lengths of the first patterns W51, W52, W53, and W54 to a certain extent. Accordingly, the semiconductor device of fourth embodiment is a semiconductor device suitable for miniaturization.

Further, since the fourth resistors R41, R42, and R43 are provided, instability caused by imbalances between the cells of the semiconductor element T1 can be reduced. However, the fourth resistors 41, R42, and R43 may be omitted if unnecessary.

Fifth Embodiment

Figure 11:
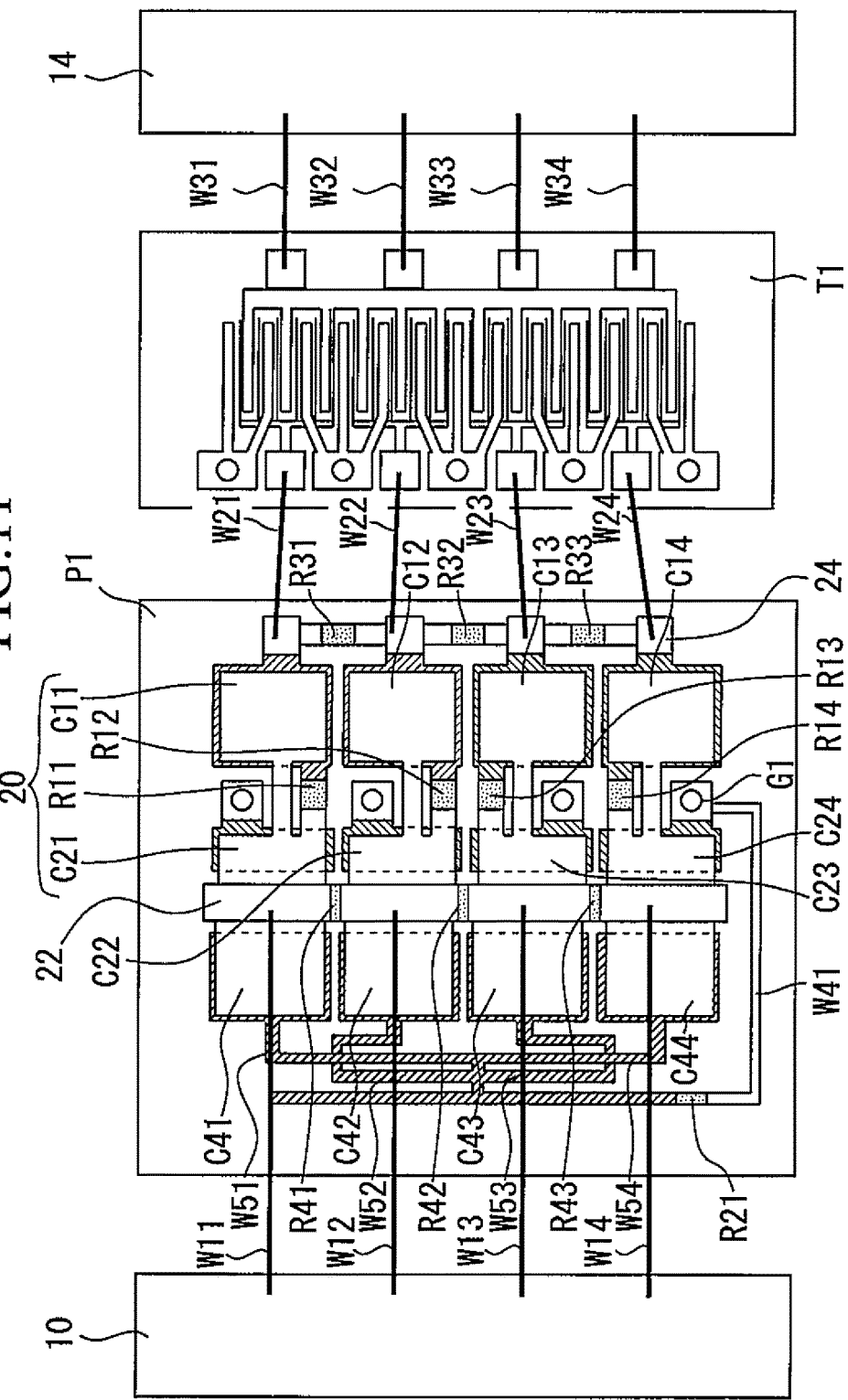
FIG. 11 is a plan view of a semiconductor device according to fifth embodiment.

FIG. 11 is a plan view of a semiconductor device according to fifth embodiment. This semiconductor device has many things in common with the semiconductor device of fourth embodiment shown in FIG. 9, and therefore differences from the semiconductor device of fourth embodiment will be mainly described.

External capacitors C41, C42, C43, and C44 are provided instead of the external capacitor C31 of fourth embodiment. An upper electrode of the external capacitor C41 is connected to the first pad 22, and a lower electrode thereof is connected to the first pattern W51. Similarly, upper electrodes of the external capacitors C42, C43, and C44 are respectively connected to the first pads 22, and lower electrodes thereof are respectively connected to the first patterns W52, W53, and W54.

The connecting inductor W41 is a wiring pattern provided on the input pre-matched substrate P1. This connecting inductor W41 connects the second resistor R21 and the via G1.

Figure 12:
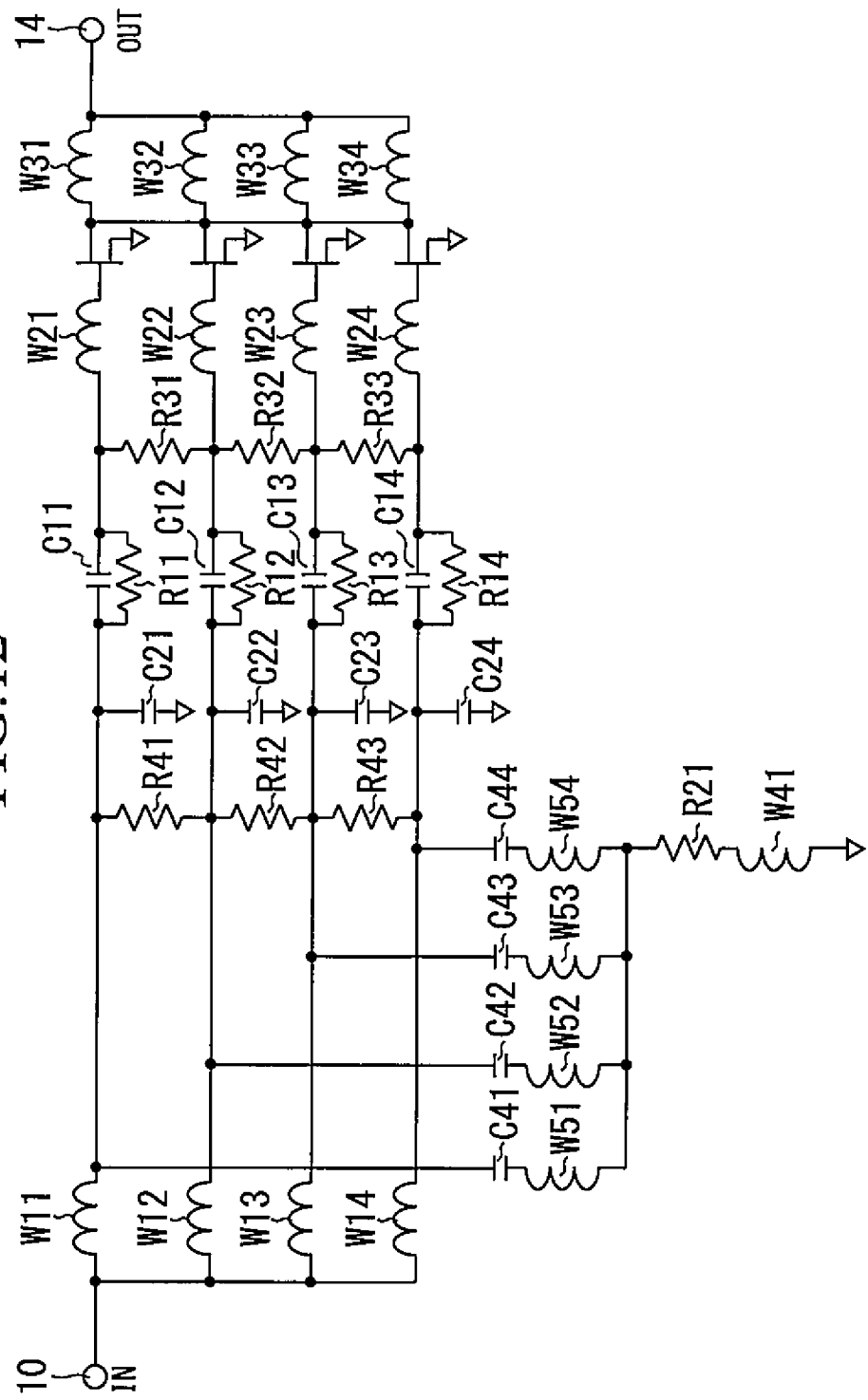
FIG. 12 is an equivalent circuit diagram of the semiconductor device of FIG. 11.

The second stabilization circuit includes the external capacitors C41, C42, C43, and C44, the first patterns W51, W52, W53, and W54, the second resistor R21, and the connecting inductor W41. This second stabilization circuit is connected to the package 12 through the vias G1. It should be noted that FIG. 12 is an equivalent circuit diagram of the semiconductor device of FIG. 11.

Since the external capacitors C41, C42, C43, and C44 of the second stabilization circuit are provided on the input pre-matched substrate P1, the connecting inductor W41 does not need to be extended to the outside of the input pre-matched substrate P1 and connected to a capacitor located outside the input pre-matched substrate P1. Accordingly, the number of components can be made smaller than that of the semiconductor device of fourth embodiment. Moreover, characteristic variation caused by assembly variation can be made small.

Sixth Embodiment

Figure 13:
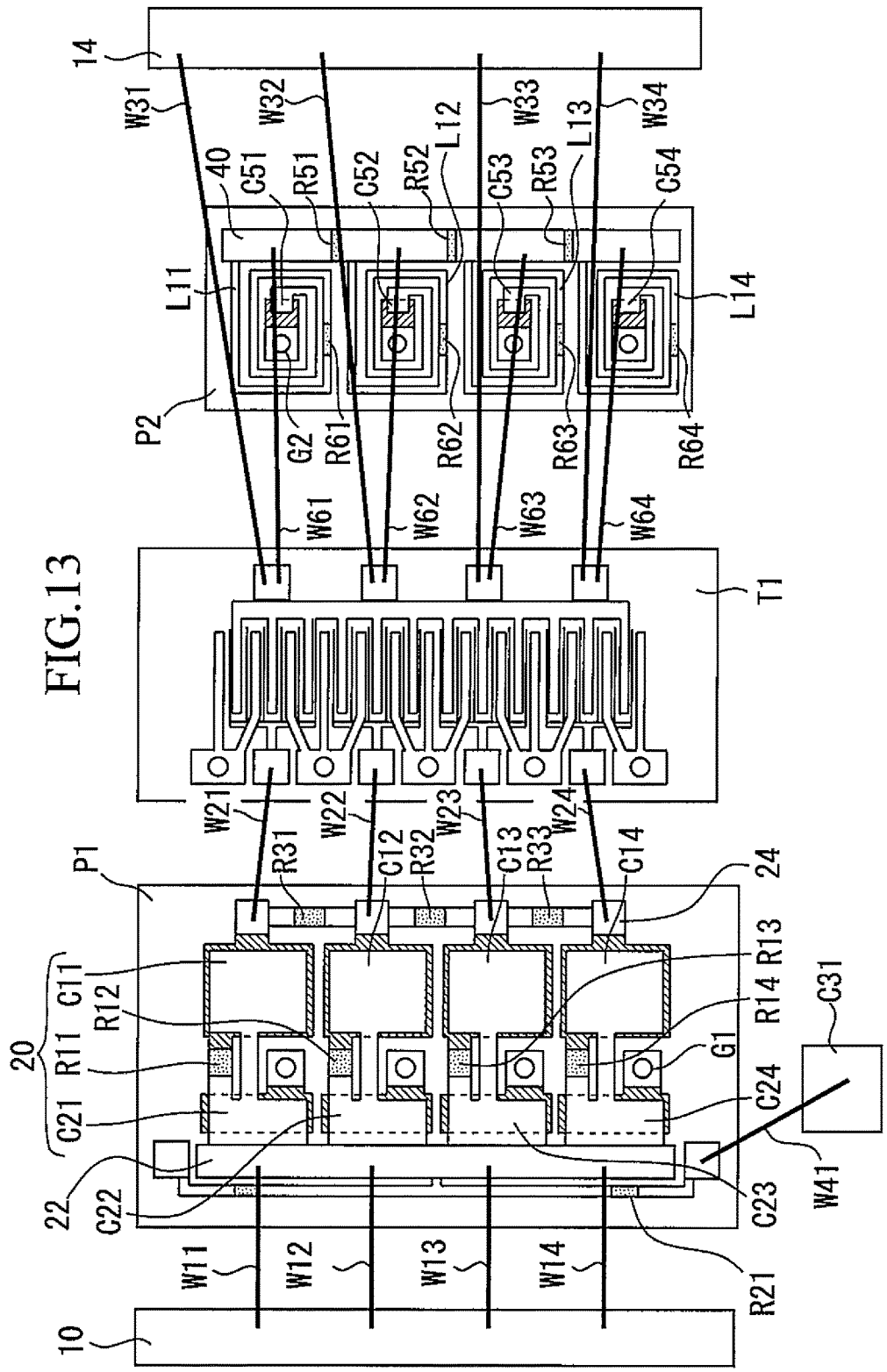
FIG. 13 is a plan view of a semiconductor device according to sixth embodiment.

FIG. 13 is a plan view of a semiconductor device according to sixth embodiment. This semiconductor device has many things in common with the semiconductor device of third embodiment shown in FIG. 7, and therefore differences from the semiconductor device of third embodiment will be mainly described.

An output pre-matched substrate P2 is provided in the package. Second pads 40 are formed on the output pre-matched substrate P2. Further, an output-side circuit element is formed on the output pre-matched substrate P2. The output-side circuit element includes four structures. One structure includes an interconnection L11 having one end connected to the second pad 40, a resistor R61 disposed at a position in the interconnection L11, a capacitor C51 connected to other end of the interconnection L11, and output-side via G2 connected to the capacitor C51. The capacitor C51 is an MIM capacitor including an upper electrode connected to the interconnection L11, a lower electrode (diagonally shaded portion) connected to the output-side via G2, and a dielectric provided therebetween. The output-side via G2 is a portion for electrically connecting the capacitor C51 and the package.

While one structure of the output-side circuit element has been described, three other structures have structures similar to the above-described one. The three other structures include interconnections L12, L13, and L14, resistors R62, R63, and R64, capacitors C52, C53, and C54, and output-side vias. Thus, the output-side circuit element is connected to the package 12 through the output-side vias G2 formed in the output pre-matched substrate P2.

Figure 14:
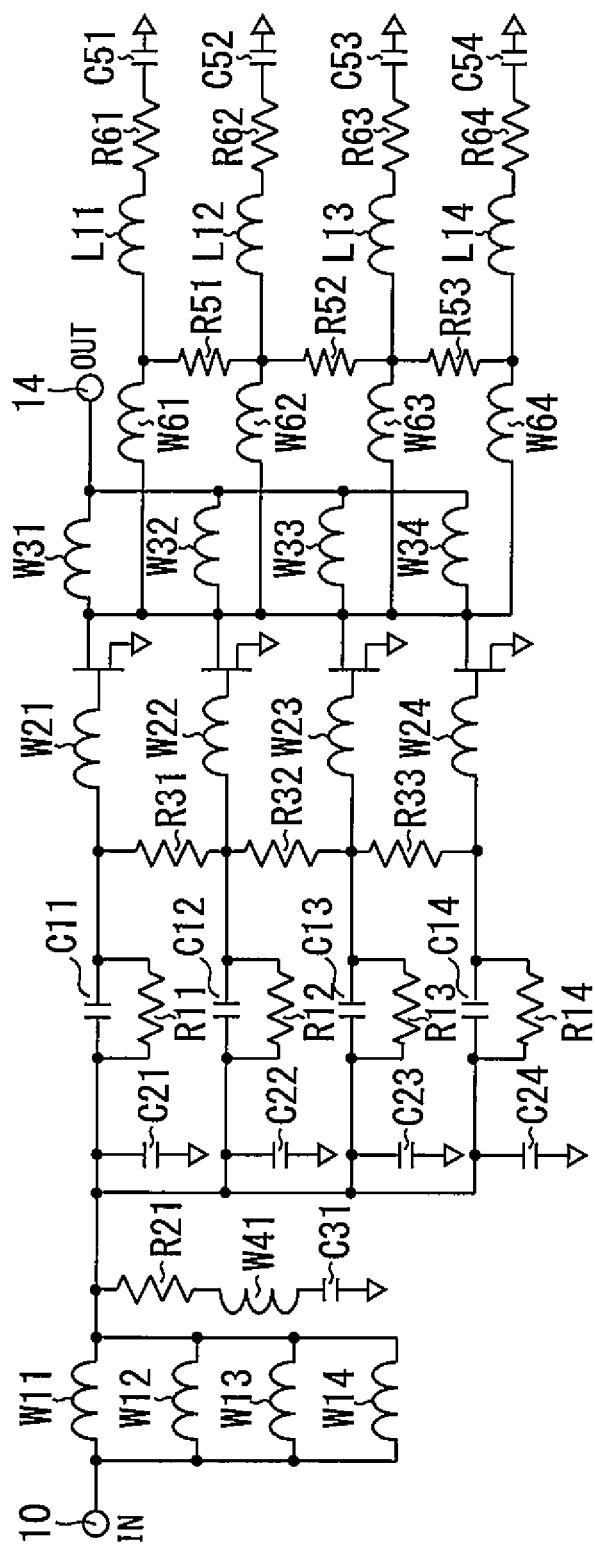
FIG. 14 is an equivalent circuit diagram of the semiconductor device of FIG. 13.

Outputs (drains) of the semiconductor element T1 are connected to the second pads 40 with third wires W61, W62, W63, and W64. Moreover, the drains of the semiconductor element T1 are connected to the output terminal 14 with output wires W31, W32, W33, and W34. The plurality of second pads 40 are connected to each other with resistors R51, R52, and R53. An equivalent circuit diagram of the semiconductor device of FIG. 13 is shown in FIG. 14.

Circuit constants of the third wires W61, W62, W63, and W64, the interconnections L11, L12, L13, and L14, and the capacitors C51, C52, C53, and C54 are set so that resonance occurs in a range of frequencies lower than a desired frequency band (frequency band to be used). In a low-frequency range, loss is increased by the resistors R61, R62, R63, and R64, the semiconductor device becomes stable. Accordingly, instability caused by drain-side factors can be reduced. Moreover, the third wires W61, W62, W63, and W64 and the aforementioned output-side circuit element act as shunt inductances at frequencies to be used, and therefore act as part of a matching circuit.

Seventh Embodiment

Figure 15:
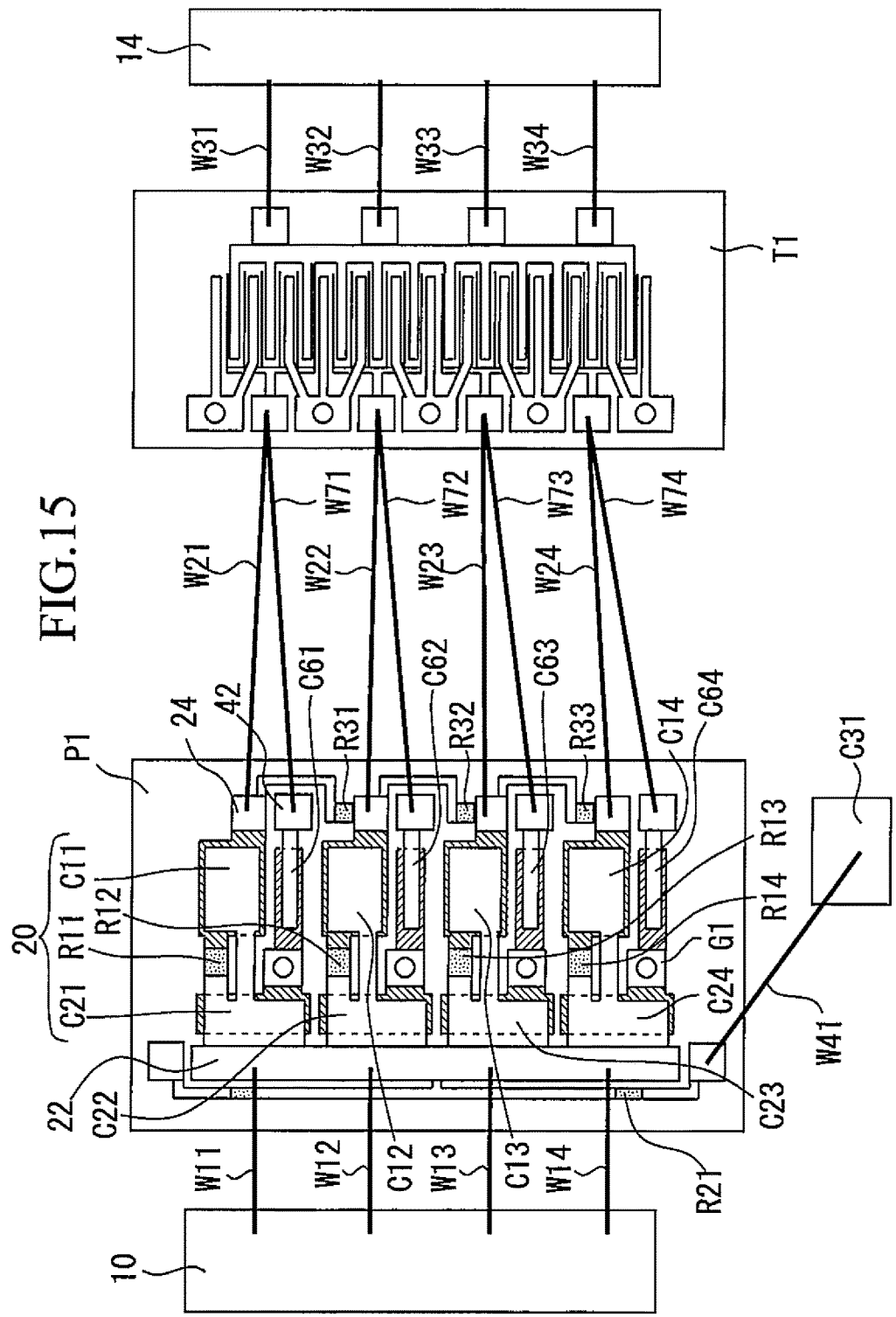
FIG. 15 is a plan view of a semiconductor device according to seventh embodiment.

FIG. 15 is a plan view of a semiconductor device according to seventh embodiment. This semiconductor device has many things in common with the semiconductor device of third embodiment shown in FIG. 7, and therefore differences from the semiconductor device of third embodiment will be mainly described.

Capacitors C61, C62, C63, and C64 are formed on the input pre-matched substrate P1. Upper electrodes of the capacitors C61, C62, C63, and C64 are connected to pads 42. The pads 42 and inputs of the semiconductor element are connected to each other with wires W71, W72, W73, and W74. Lower electrodes (shaded portions) of the capacitors C61, C62, C63, and C64 are connected to the vias G1.

Figure 16:
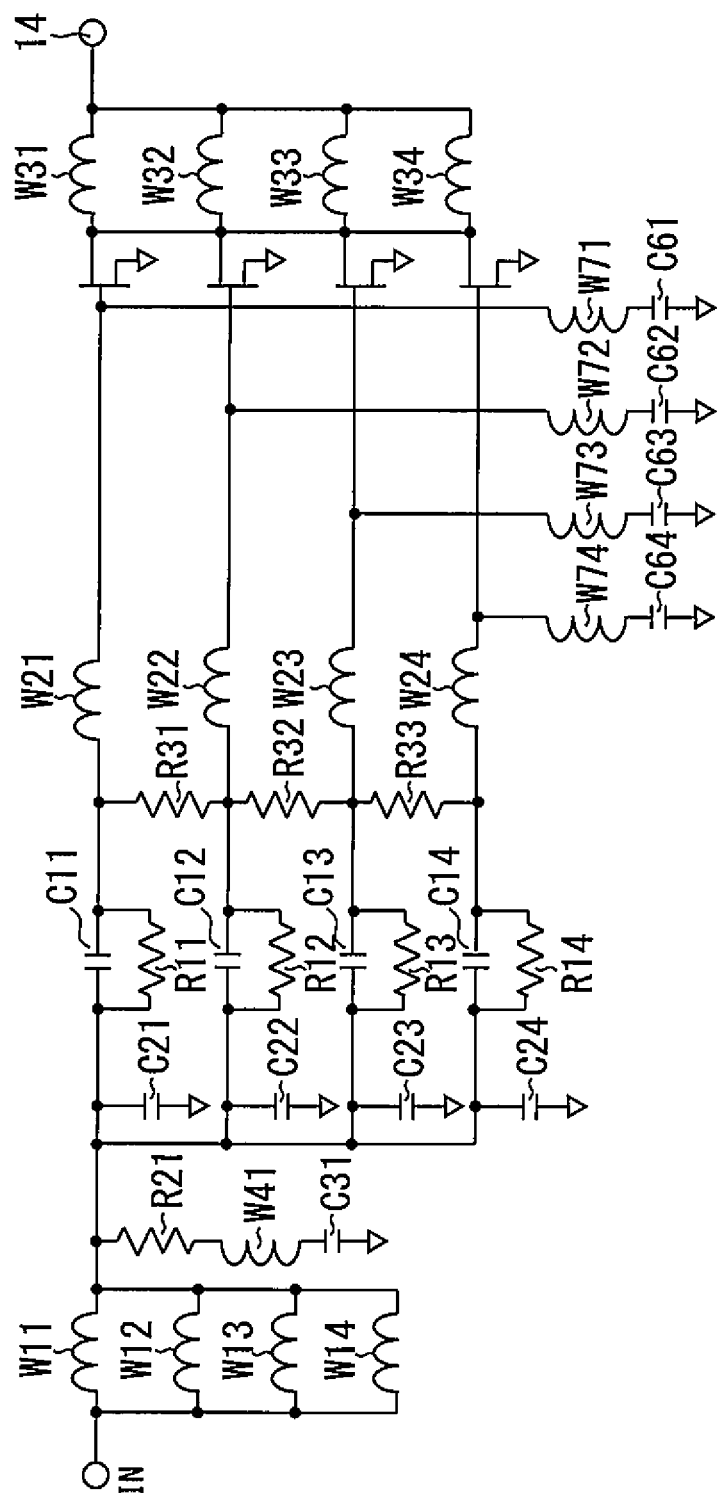
FIG. 16 is an equivalent circuit diagram of the semiconductor device of FIG. 15.

FIG. 16 is an equivalent circuit diagram of the semiconductor device of FIG. 15. The capacitors C61, C62, C63, and C64 and the wires W71, W72, W73, and W74 constitute harmonic circuits which are matching circuits for harmonics. The harmonic circuits connect the inputs of the semiconductor element T1 and the vias G1, and function as matching circuits for harmonics. As can be seen in FIG. 15, the harmonic circuit are formed for the cells of the semiconductor element T1.

Since the above-described harmonic circuits, the first MIM capacitors C21, C22, C23, and C24, and the first and second stabilization circuits are integrally formed on the input pre-matched substrate P1, the size of the semiconductor device can be reduced. Moreover, since the matching circuit and the harmonic circuit are integrated, a structure which is relatively immune to assembly variation is obtained.

Arranging the harmonic circuits and the matching circuits (circuit element 20 and the like) in a staggered manner in planar view improves the isolation between transistor cells. Accordingly, stable operation is expected. It should be noted that features of the semiconductor devices of the embodiments described above may be combined as appropriate.

In the present invention, a shunt capacitor connected to a via and a stabilization circuit are formed on an input pre-matched substrate. Accordingly, a semiconductor device in which unstable operation can be reduced and which is suitable for miniaturization can be provided.

Obviously many modifications and variations of the present invention are possible in the light of the above teachings. It is therefore to be understood that within the scope of the appended claims the invention may be practiced otherwise than as specifically described.

What is claimed is:

1. A semiconductor device comprising:
  a package;
  an input terminal fixed to the package;
  an input pre-matched substrate provided in the package;
  a semiconductor element provided in the package and formed on a substrate different from the input pre-matched substrate;
  a matching circuit comprising a circuit element formed on the input pre-matched substrate, a first wire for connecting the input terminal and the circuit element, and a second wire for connecting the circuit element and the semiconductor element;
  a first MIM capacitor formed as part of the circuit element, the first MIM capacitor comprising a lower electrode and an upper electrode, the lower electrode having a first side formed on a surface of the input pre-matched substrate and a second side opposite the first side and facing in a direction of the upper electrode; and
  a first stabilization circuit formed as part of the circuit element to reduce oscillation,
  wherein the lower electrode of the first MIM capacitor is connected to the package through a via provided in the input pre-matched substrate and extending from the surface of the input pre-matched substrate in a direction opposite the direction of the upper electrode.

2. The semiconductor device according to claim 1 wherein the first stabilization circuit comprises:
  a second MIM capacitor formed on the input pre-matched substrate to share an upper electrode with the first MIM capacitor; and
  a first resistor formed on the input pre-matched substrate and connected in parallel to the second MIM capacitor.

3. The semiconductor device according to claim 1, further comprising:
  a harmonic circuit comprising a capacitor formed on the input pre-matched substrate, the harmonic circuit being a matching circuit for harmonics,
  wherein the harmonic circuit connects an input of the semiconductor element and the via.

4. A semiconductor device comprising:
  a package;

an input terminal fixed to the package;
an input pre-matched substrate provided in the package;
a semiconductor element provided in the package and formed on a substrate different from the input pre-matched substrate;
a matching circuit comprising a circuit element formed on the input pre-matched substrate, a first wire for connecting the input terminal and the circuit element, and a second wire for connecting the circuit element and the semiconductor element;
a first MIM capacitor formed as part of the circuit element;
a first stabilization circuit formed as part of the circuit element to reduce oscillation,
wherein a lower electrode of the first MIM capacitor is connected to the package through a via provided in the input pre-matched substrate, and
wherein the first stabilization circuit comprises:
a second MIM capacitor formed on the input pre-matched substrate to share an upper electrode with the first MIM capacitor; and
a first resistor formed on the input pre-matched substrate and connected in parallel to the second MIM capacitor; and the semiconductor device further comprising:
a first pad formed on the input pre-matched substrate, the first pad having the first wire connected thereto; and
a second stabilization circuit connecting the first pad and the package,
wherein the second stabilization circuit comprises:
a second resistor formed on the input pre-matched substrate;
an external capacitor provided in the package; and
a connecting inductor.

5. The semiconductor device according to claim 4, wherein effective frequencies of the first stabilization circuit and those of the second stabilization circuit are different from each other.

6. The semiconductor device according to claim 4, wherein the external capacitor is formed on the input pre-matched substrate.

7. The semiconductor device according to claim 4, further comprising:
the plurality of first MIM capacitors;
the plurality of first stabilization circuits; and
third resistors for connecting the plurality of first stabilization circuits.

8. The semiconductor device according to claim 4, further comprising:
the plurality of first MIM capacitors;
the plurality of first stabilization circuits;
the plurality of first pads; and
a plurality of first patterns formed on the input pre-matched substrate to connect the first pads and the second resistor,
wherein lengths of the plurality of first patterns are equal.

9. The semiconductor device according to claim 8, further comprising: a fourth resistor for connecting the plurality of first pads.

10. The semiconductor device according to claim 4, wherein the second stabilization circuit is connected to the package through the via.

11. The semiconductor device according to claim 10, further comprising:
the plurality of first MIM capacitors;
the plurality of first stabilization circuits;
the plurality of first pads; and
the plurality of second stabilization circuits.

12. A semiconductor device comprising:
a package;
an input terminal fixed to the package;
an input pre-matched substrate provided in the package;
a semiconductor element provided in the package and formed on a substrate different from the input pre-matched substrate;
a matching circuit comprising a circuit element formed on the input pre-matched substrate, a first wire for connecting the input terminal and the circuit element, and a second wire for connecting the circuit element and the semiconductor element;
a first MIM capacitor formed as part of the circuit element;
a first stabilization circuit formed as part of the circuit element to reduce oscillation;
wherein a lower electrode of the first MIM capacitor is connected to the package through a via provided in the input pre-matched substrate; and the semiconductor device further comprising:
an output pre-matched substrate provided in the package;
an output terminal fixed to the package;
an output wire for connecting an output of the semiconductor element and the output terminal;
an output-side circuit element formed on the output pre-matched substrate; and
a third wire for connecting an output of the semiconductor element and the output-side circuit element,
wherein the output-side circuit element is connected to the package through an output-side via formed in the output pre-matched substrate.

* * * * *